(12) United States Patent
El-Essawy et al.

(10) Patent No.: US 9,135,577 B2
(45) Date of Patent: Sep. 15, 2015

(54) STATISTICAL DETERMINATION OF POWER-CIRCUIT CONNECTIVITY

(71) Applicant: International Business Machines Corporation, Armonk, NY (US)

(72) Inventors: Wael R. El-Essawy, Austin, TX (US);
Alexandre P. Ferreira, Austin, TX (US);
Thomas W. Keller, Jr., Austin, TX (US);
Sani R. Nassif, Austin, TX (US);
Karthick Rajamani, Austin, TX (US);
Juan C. Rubio, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 13/648,441

(22) Filed: Oct. 10, 2012

(65) Prior Publication Data
US 2014/0100804 A1 Apr. 10, 2014

(51) Int. Cl.
*G06F 19/00* (2011.01)
*G06Q 10/00* (2012.01)
*G06F 1/00* (2006.01)

(52) U.S. Cl.
CPC . *G06Q 10/00* (2013.01); *G06F 1/00* (2013.01)

(58) Field of Classification Search
USPC .............................. 702/64, 66, 182–185, 188
See application file for complete search history.

(56) References Cited

U.S. PATENT DOCUMENTS

| | | | |
|---|---|---|---|
| 3,937,899 A | 2/1976 | Denenberg | |
| 5,323,337 A | 6/1994 | Wilson et al. | |
| 6,078,567 A | 6/2000 | Traill et al. | |
| 6,762,987 B2 | 7/2004 | Langereis et al. | |
| 7,148,743 B2 | 12/2006 | Paille et al. | |
| 7,230,414 B2 | 6/2007 | Bruno | |
| 7,269,753 B2 | 9/2007 | Farkas et al. | |
| 7,333,000 B2 | 2/2008 | Vassallo | |
| 7,643,972 B2 | 1/2010 | Lada | |
| 7,751,469 B2 | 7/2010 | Eldar et al. | |

(Continued)

FOREIGN PATENT DOCUMENTS

| | | | |
|---|---|---|---|
| JP | 7-229337 A | 8/1995 | |
| JP | 10-23081 A | 1/1998 | |

OTHER PUBLICATIONS

Office Action mailed Oct. 22, 2013, U.S. Appl. No. 13/217,624, 11 pages.

(Continued)

*Primary Examiner* — Edward Raymond
(74) *Attorney, Agent, or Firm* — Francis Lammes; Stephen J. Walder, Jr.; William J. Stock

(57) ABSTRACT

A mechanism is provided for statistical determination of power circuit connectivity based on signal detection in a circuit. Signal data from the circuit gathered and a determination is made as to whether a signal of interest is present in the gathered signal data from the circuit using a statistical analysis of the gathered signal data. The statistical analysis comprises using a mean current value and statistical deviation of the current value of the signal data over a predetermined period of time to compute a confidence range. The confidence range is compared to a first threshold and a second threshold. A determination is made that the signal is present in response to the confidence range being above the first threshold. A determination is made that the signal is not present in response to the confidence range being below the second threshold.

20 Claims, 3 Drawing Sheets

(56) References Cited

U.S. PATENT DOCUMENTS

| | | |
|---|---|---|
| 2009/0198474 A1* | 8/2009 | Fritz et al. .................... 702/183 |
| 2009/0217073 A1 | 8/2009 | Brech et al. |
| 2009/0307515 A1 | 12/2009 | Bandholz et al. |
| 2010/0169247 A1 | 7/2010 | Srebranig |
| 2010/0174472 A1 | 7/2010 | Matsushima et al. |
| 2010/0211810 A1 | 8/2010 | Zacho |
| 2011/0101956 A1 | 5/2011 | Thorn |
| 2012/0099633 A1 | 4/2012 | Casagrande |
| 2013/0054999 A1 | 2/2013 | Allen-Ware et al. |

OTHER PUBLICATIONS

Office Action dated Dec. 10, 2013, U.S. Appl. No. 13/459,945, 11 pages.

Allen-Ware, Malcolm S. et al., "Branch Circuit Determination with Synchronous Correlation", U.S. Appl. No. 13/217,624, filed Aug. 25, 2011, 40 pages.

Allen-Ware, Malcolm S. et al., "Branch Circuit Determination with Synchronous Correlation", U.S. Appl. No. 13/459,945, filed Apr. 30, 2012, 36 pages.

Ferreira, A. et al., "BCID: An Effective Data Center Power Mapping Technology", Third International Green Computing Conference (IGCC'12), San Jose, California, Jun. 5-8, 2012, 10 pages.

* cited by examiner

STATISTICAL DETERMINATION OF POWER-CIRCUIT CONNECTIVITY

BACKGROUND

The present application relates generally to an improved data processing apparatus and method and more specifically to mechanisms for statistically determining power-circuit connectivity.

Data processing environments often include multiple data processing systems. The data processing systems each have a need for electrical power for performing their respective functions.

An electrical power distribution system can supply power to several data processing systems. Particularly, an electrical power distribution system includes several power branch circuits, each power branch circuit supplying power to several systems and equipment in the data processing environment.

Knowing which system is supplied power from which power branch circuit is important. In a data processing environment, the number and location of the systems, equipment, and power branch circuits can result in a complex network of interconnected systems and power branch circuits. Consequently, learning the relationships between systems and corresponding power branch circuits is a non-trivial problem.

SUMMARY

In one illustrative embodiment, a method, in a data processing system, is provided for statistical determination of power circuit connectivity based on signal detection in a circuit. The illustrative embodiment gathers signal data from the circuit. The illustrative embodiment determines whether a signal of interest is present in the gathered signal data from the circuit using a statistical analysis of the gathered signal data. In the illustrative embodiment, the statistical analysis comprises using a mean current value and statistical deviation of the current value of the signal data over a predetermined period of time to compute a confidence range and comparing the confidence range to a first threshold and a second threshold. In the illustrative embodiment, a determination that the signal is present is made in response to the confidence range being above the first threshold. In the illustrative embodiment, determination that the signal is not present is made in response to the confidence range being below the second threshold.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
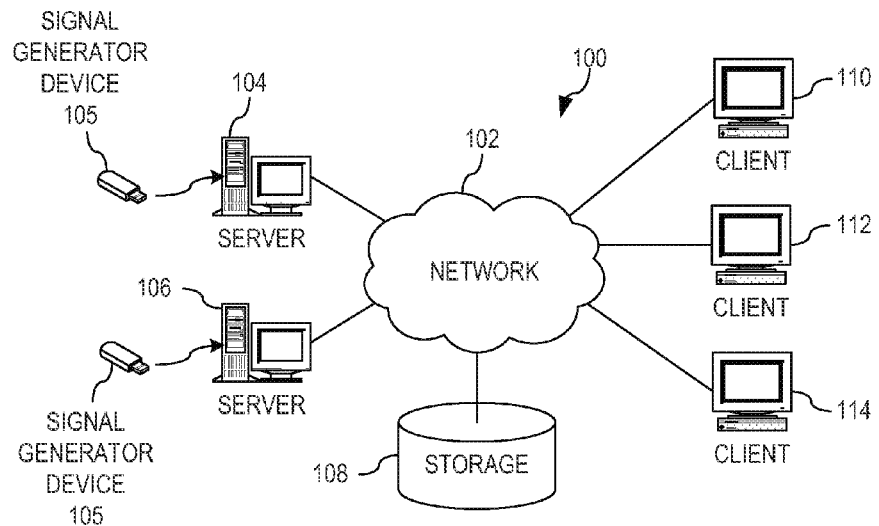
FIG. 1 is an example diagram of a distributed data processing system in which aspects of the illustrative embodiments may be implemented.

In certain data processing environment configurations, several data processing systems may be configured to receive power from a power branch circuit and several such power branch circuits may provide to several data processing systems. For example, servers 1, 4, 5, 13, and 19 may be supplied power from power branch circuit 1; servers 2, 6, 7, 15, 16, and 20 may be supplied power from power branch circuit 2; servers 3, 8, 9, and 10 may be supplied power from power branch circuit 3; servers 11, 12, and 14 may be supplied power from power branch circuit 4; and servers 17 and 18 may be supplied power from power branch circuit 5.

Furthermore, systems in a data processing environment may be switched from one power branch circuit to another for a variety of reasons. For example, equipment in power branch circuit 4 may have to be shut down for maintenance and the load redistributed to other power branch circuits according to available capacity on those power branch circuits at that time.

As can be seen, with just twenty example servers and five power branch circuits, managing the information about which system receives power from which power branch circuit at any given time is a problem that requires some solution. Manually keeping track of such relationships may work for relatively small data processing environments. However, the embodiments recognize that for large number of systems and power branch circuits typically present in a data processing environment, the problem requires a more sophisticated solution.

The embodiments further recognize that causing the system to identify itself, such as by executing a particular code with a specific load characteristic, or by transmitting a system identifier from the system, requires access to the system. The embodiments recognize that service personnel, maintenance technicians, and other personnel in a data processing environment may not be able to log-on to a system or otherwise access the system for executing code thereon or transmitting identifiers therefrom. The embodiments recognize that allowing access to a system in a data processing environment, such as for executing code is a security risk. The embodiments also recognize that physical access to the systems, without the ability to log-on to the systems is often available to data processing environment personnel. For example, a technician may be able to touch a system, move a system, or connect a device to a port on the system without having a login ID and password to the system.

The illustrative embodiments used to describe the invention generally address and solve the above-described system-to-power branch circuit matching problems by statistically determining power-circuit connectivity. In order to statistically determine power-circuit connectivity, the mechanisms compute a sampled mean current value and standard deviation of the current value for a correlation signal. The mechanisms then compute a confidence range of the sampled mean current value and standard deviation of the current value over a number of integration cycles. Then utilizing the confidence range, the mechanisms discriminate whether the correlation signal is present, not present, or there is not enough data to provide a definitive response as to whether the signal is present or not. Additionally, if the response is that there is not enough data to provide a definitive response as to whether the signal is present or not, the mechanisms may also provide an estimate as to an amount of time required to provide the definitive response as to whether the signal is present or not.

The various embodiments described herein are with respect to a simplified relationship between a limited number of systems and power branch circuits only for the clarity of the disclosure. The concepts, methods, products, systems, operations, actions, configurations, or manipulations described herein with respect to matching a system to a power branch circuit are similarly applicable to matching any number of systems to any number of power branch circuits without limitation.

Figure 2:
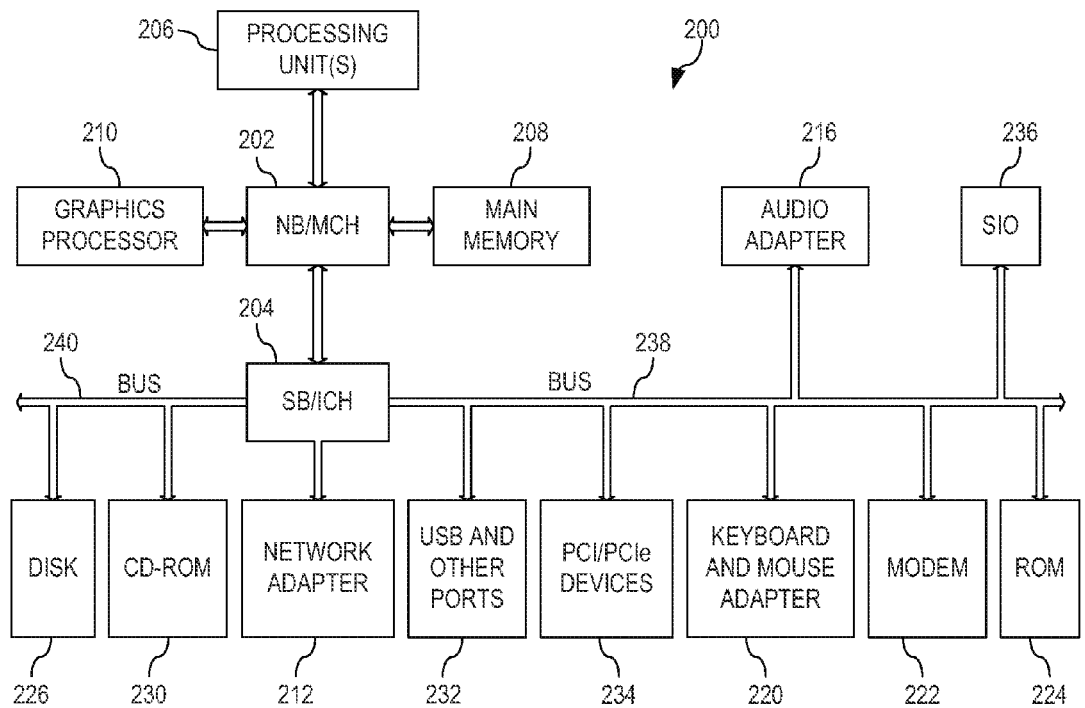
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments. FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

Signal generator device 105 may be any suitable hardware device capable of coupling with server 104 and/or server 106. For example, signal generator device 105 may couple with server 104 or server 106 using a DC powered port, such as a universal serial bus (USB) port or a serial port, available on server 104. Data processing environment 100 may be supplied by a power distribution system (not shown) using a set of power branch circuits (not shown).

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational, and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System p® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

Figure 3:
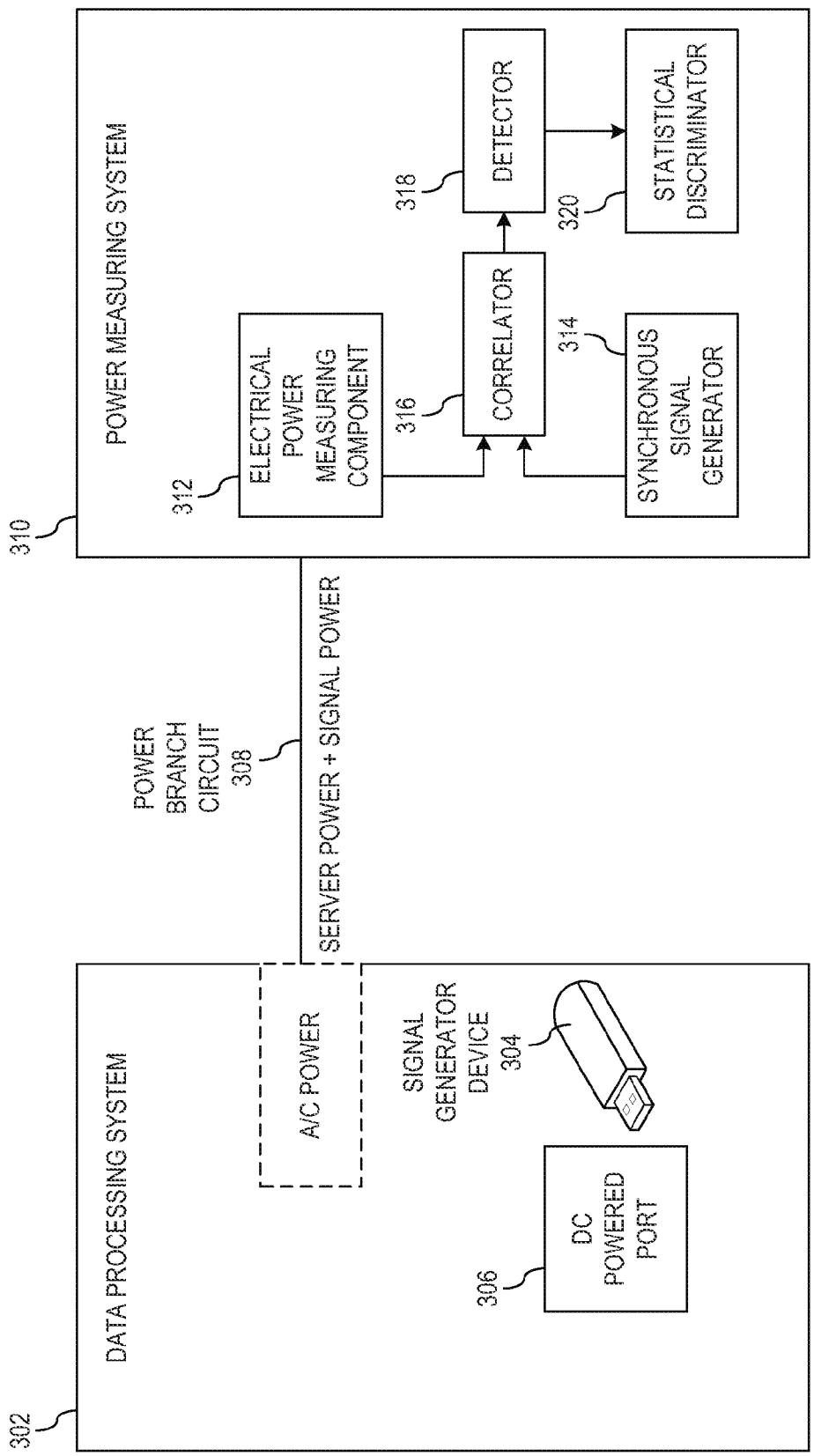
FIG. 3 depicts a block diagram of a mechanism for statistically determining power-circuit connectivity in accordance with an illustrative embodiment.

FIG. 3 depicts a block diagram of a mechanism for statistically determining power-circuit connectivity in accordance with an illustrative embodiment. Data processing system 302 may be analogous to server 104 in FIG. 1 and signal generator device 304 may be similar to signal generator device 105 in FIG. 1 and may couple to data processing system 302 using DC powered port 306.

Power branch circuit 308 supplies electrical power, typically alternating current (AC) power, to data processing system 302. Power measuring system 310 may be hardware, software, or a combination thereof, for measuring the power delivered over power branch circuit 308. For example, in one embodiment, power measuring system 310 may include electrical power measuring component 312, which may be a combination of hardware and software. Synchronous signal generator 314 may be hardware or software, correlator 316 may be a software application or firmware, and detector 318 may be a software application or a component thereof.

Signal generator device 304 generates a low-frequency low-power DC load (signal) to modulate the AC power consumed by data processing system 302. A frequency is considered low if the frequency is a fraction of the frequency of the AC power being supplied to data processing system 302. Preferably, the low frequency signal should not be of a frequency higher than half the AC power frequency. In one embodiment, for sixty hertz AC power supplied to data processing system 302, signal generator device 304 was configured to generate a signal of four to six hertz, and for one experiment, a signal of five hertz. Power of the signal generated by signal generator device 304 is considered low if signal generator device 304's load only trivially changes data processing system 302's power consumption per AC cycle. In other words, the power demand of data processing system 302 is insignificantly altered by adding the signal from signal generator device 304.

A load that is a significant portion of, or comparable to, data processing system 302's power consumption, when added to data processing system 302, would be easily detectable at power measuring system 310 to identify the correlation between data processing system 302 and power branch circuit 308. However, the embodiments recognize that adding such loads for identifying the correlation is undesirable in many circumstances, such as when the additional load may cause a power failure, system shutdown, or a spike in the power demand triggering power consumption reduction measures. Therefore, the signal generated from signal generator device 304 should preferably be a low power signal to avoid any such undesirable consequences.

Measurement component 312 measures the combined power consumption of data processing system 302 and signal generator device 304. Synchronous signal generator 314 generates a signal of the same frequency and phase as the signal of signal generator device 304. The signals of signal generator device 304 and synchronous signal generator 314 are synchronized to be in-phase by any suitable method. For example, in one embodiment, the synchronization can be accomplished using a synchronization signal, such as a global positioning system (GPS) clock. In another embodiment, the synchronization can be accomplished by an exhaustively changing the phase of synchronous signal generator 314 and determining whether a particular phase of synchronous signal generator 314's signal matches a phase of a signal in the power curve produced by measurement component 312. In another embodiment, all possible phases of the signal can be searched in parallel for detecting the signal. For example, several synchronous signals may be generated at synchronous signal generator 314, each with a different phase from all possible phases of the signal of signal generator device 304. All such different phases of the synchronous signals can be matched in parallel with the signal of signal generator device 304. Correlator 316 combines the signal generated by synchronous signal generator 314 with the power curve produced by measurement component 312. For example, the signal of synchronous signal generator 314 may be multiplied with the power curve produced by measurement component 312. Detector 318 then samples the integrated power curve.

From this point, statistical discriminator 320 computes a sample mean current value $\hat{X}$ and standard deviation of the current value $\hat{S}$ of the integration per cycle. Using the stream of data from the synchronized signal coming from correlator 316 that is detected by detector 318, statistical discriminator 320 computes the sample mean current value $\hat{X}$ and the standard deviation of the current value $\hat{S}$ of the integration at each cycle. Statistical discriminator 320 computes a confidence range utilizing a number of samples n, the sample mean current value $\hat{X}$, the standard deviation of the current value $\hat{S}$, and a t-distribution value Z for the desired confidence based on the number of samples n by solving, for example, the following equation:

$$\left(\hat{X} - (Z_{\alpha/2})\frac{\hat{S}}{\sqrt{n}}\right) < \overline{X} < \left(\hat{X} + (Z_{\alpha/2})\frac{\hat{S}}{\sqrt{n}}\right)$$

where $\overline{X}$ is the population average and where $\alpha$ is the desired confidence.

Once statistical discriminator 320 computes the confidence range, then, for a measured sample mean current value, statistical discriminator 320 determines whether the lower value of the confidence range (left side of equation) is higher than a predetermined high threshold value. If statistical discriminator 320 determines that the lower value of the confidence range (left side of equation) is higher than the predetermined high threshold value, then statistical discriminator 320 may clearly indicate that the signal is present. If statistical discriminator 320 determines that the lower value of the confidence range (left side of equation) fails to be higher than the predetermined high threshold value, then statistical discriminator 320 determines whether the higher value of the confidence range (right side of equation) is lower than a predetermined low threshold value. If statistical discriminator 320 determines that the confidence range (right side of equation) is lower than the predetermined low threshold value, then statistical discriminator 320 may clearly indicate that the signal is not present.

If statistical discriminator 320 determines that the lower value of the confidence range (left side of equation) fails to be higher than a predetermined high threshold value and that the confidence range (right side of equation) fails to be lower than the predetermined low threshold value, then statistical discriminator 320 determines whether the sample mean current value $\hat{X}$ is higher than the average of the predetermined high threshold and the predetermined low threshold. If statistical discriminator 320 determines that the sample mean current value $\hat{X}$ is higher than an average of the predetermined high threshold and the predetermined low threshold, then statistical discriminator 320 may indicate a probability that the signal is present. However, in order to provide a definitive response, statistical discriminator 320 computes a current confidence utilizing the following equation:

$$Z_{\alpha/2} = |(\text{Threshold} - \hat{X})|\frac{\sqrt{n}}{\hat{S}}$$

where the threshold is the predetermined high threshold. Statistical discriminator 320 also determines a number of samples required to achieve the desired confidence utilizing the following equation:

$$n = \left(\frac{Z_{\alpha/2} \cdot \hat{S}}{|(\text{Threshold} - \hat{X})|}\right)^2$$

where the threshold is the predetermined high threshold. Once the number of samples is determined, statistical discriminator 320 returns the wait time based on the number of samples and then continues with measuring the combined power consumption of data processing system 302 and signal generator device 304 as described above.

Alternatively, if statistical discriminator 320 determines that the sample mean current value $\overline{X}$ is lower than an average of the predetermined high threshold and the predetermined low threshold, then statistical discriminator 320 may indicate a probability that the signal is not present. However, in order to provide a definitive response, statistical discriminator 320 computes a current confidence utilizing the following equation:

$$Z_{\alpha/2} = |(\text{Threshold} - \hat{X})|\frac{\sqrt{n}}{\hat{S}}$$

where the threshold is the predetermined low threshold. Statistical discriminator 320 also determines a number of samples required to achieve the desired confidence utilizing the following equation:

$$n = \left(\frac{Z_{\alpha/2} \cdot \hat{S}}{|(\text{Threshold} - \hat{X})|}\right)^2$$

where the threshold is the predetermined low threshold. Once the number of samples is determined, statistical discriminator 320 returns the wait time based on the number of samples and then continues with measuring the combined power consumption of data processing system 302 and signal generator device 304 as described above.

In addition to determining a confidence when a probability indicates that the signal is present or not present, if statistical discriminator 320 determines that the lower value of the confidence range (left side of equation) fails to be higher than a predetermined high threshold value and that the confidence range (right side of equation) fails to be lower than the predetermined low threshold value, statistical discriminator 320 may determine both a confidence of whether the signal is present and confidence of whether the signal is not present. Statistical discriminator 320 may then utilize the higher of the two determined confidences as an indication of whether the signal is present or not present.

As an example, assuming the predetermined high threshold value is 8 mA and predetermined low threshold value is 5 mA with a required 95% confidence, then the population average $\overline{X}$ must be below 8 mA with 95% confidence for the result to be the signal is not present or the population average $\overline{X}$ must be above 5 mA with 95% confidence to be considered present. Continuing with this example, consider current measured values, sample mean current value $\hat{X}$ is 10 mA and standard deviation of the current value $\hat{S}$ is 36 mA after 25 samples. Then, $\hat{S}$ over the square root of n samples is 7.31 mA which implies that t-distribution value Z needs to be equal to or less than 0.684 so the lower confidence value is larger than 5 mA. A t-distribution value Z of 0.684 at 25 samples implies a confidence value of 75%. Assuming that the sample mean current value $\hat{X}$ and the standard deviation of the current value $\hat{S}$ are constant and to achieve a confidence of 95% the t-distribution value Z for n=25 is 1.708. Using the equations, the statistical discriminator determines that 151 samples are required to achieve the 95% confidence value. Therefore, since only 25 samples have been taken, 126 additional samples are still required and, at 5 samples per second for example, 25.2 seconds are still required to achieve the 95% confidence value.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4:
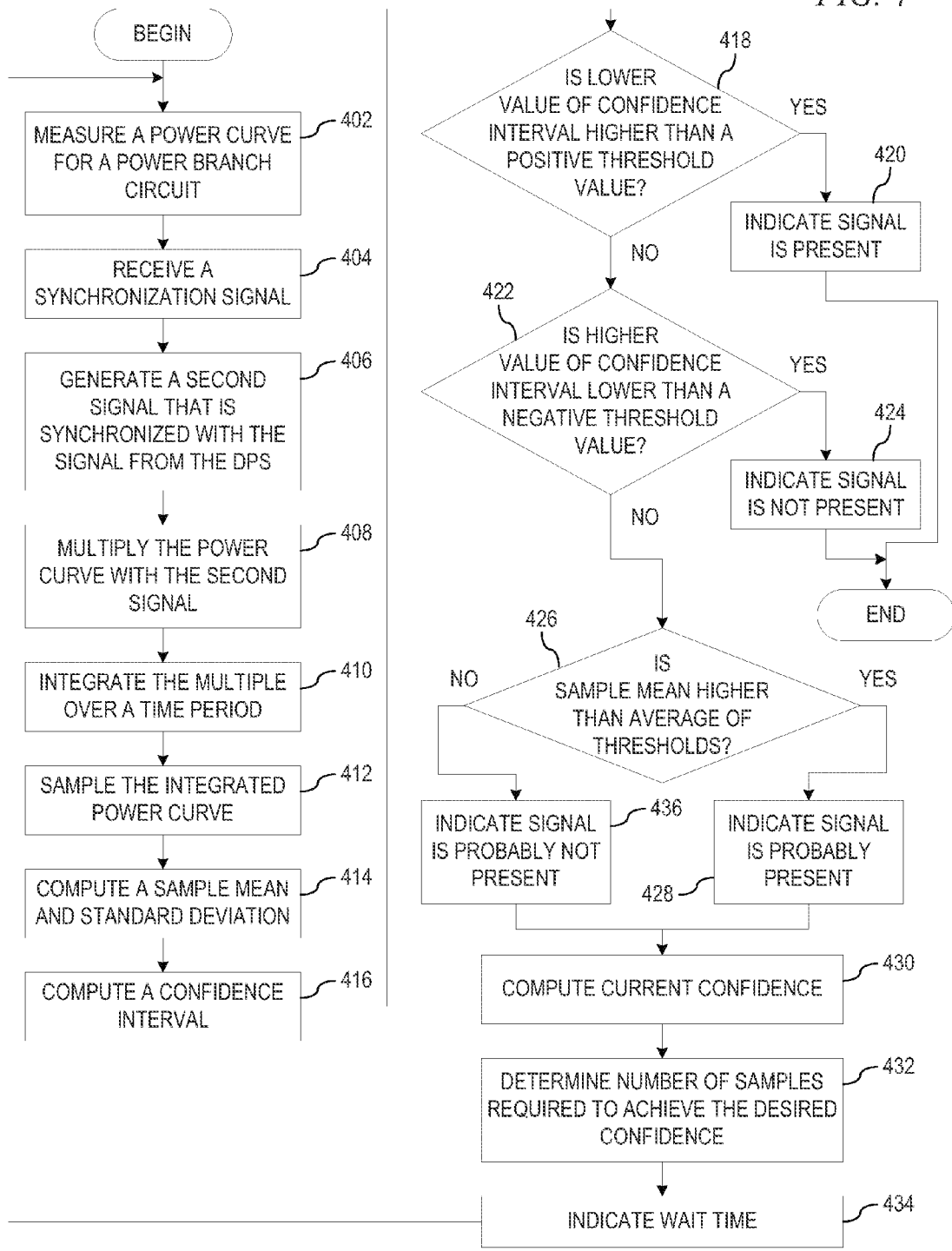
FIG. 4 depicts a flow diagram of the process performed by a power measuring system in accordance with an illustrative embodiment.

FIG. 4 depicts a flow diagram of the process performed by a power measuring system, such as power measuring system 310 of FIG. 3, in accordance with an illustrative embodiment. As the operation begins, the power measuring system measures a power curve for a power branch circuit (step 402). For example, the power measuring system may monitor and measure the per cycle power consumption over a power branch circuit and plot the measured power as a power curve over a period. Note that the power curve measured in this manner includes the power consumption of the data processing system as well as the power consumed by the low power modulating signal.

The power measuring system then receives a synchronization signal, such as a GPS signal (step 404). The power measuring system generates a second signal, such as the synchronous signal generated by synchronous signal generator 314 of FIG. 3, that is synchronized with the low-frequency low-power DC load (signal) generated at the data processing system (DPS), which is being detected (step 406). For example, the power measuring system may use the GPS signal to synchronize the second signal (the synchronous signal) with the low-frequency low-power DC load (signal) generated at the data processing system. The power measuring system then multiplies the power curve with the second signal (step 408) and integrates the multiple of the power curve and the second signal over a time period (step 410). The power measuring system then samples the integrated multiple of the power curve and the second signal (the integral) at certain points in time during the period (step 412).

Utilizing the sampled signals, the power measuring system computes a sample mean current value $\hat{X}$ and standard deviation of the current value $\hat{S}$ of the integration per cycle (step 414). That is, using the stream of data from the synchronized signal coming from a correlator that is detected by a detector, the power measuring system computes the sample mean current value $\hat{X}$ and the standard deviation of the current value $\hat{S}$ of the integration at each cycle. Assuming that the data distribution is Gaussian, the power measuring system computes a confidence range utilizing a number of samples n, the sample mean current value $\hat{X}$, the standard deviation of the current value $\hat{S}$, and a t-distribution value Z for the desired confidence based on the number of samples n (step 416) by solving, for example, the following equation:

$$\left(\hat{X} - (Z_{\alpha/2})\frac{\hat{S}}{\sqrt{n}}\right) < \overline{X} < \left(\hat{X} + (Z_{\alpha/2})\frac{\hat{S}}{\sqrt{n}}\right)$$

where $\overline{X}$ is the population average and where a is the desired confidence.

Once the power measuring system computes the confidence range, then for a measured sample mean current value $\hat{X}$, the power measuring system determines whether the lower value of the confidence range is higher than a predetermined high threshold value (step 418). If at step 418 the power measuring system determines that the lower value of the confidence range (left side of equation) is higher than the predetermined high threshold value, then the power measuring system indicates that the signal is present (step 420), with the operation ending thereafter. If at step 418 the power measuring system determines that the lower value of the confidence range (left side of equation) fails to be higher than the predetermined high threshold value, then the power measuring system determines whether the higher value of the confidence range (right side of equation) is lower than a predetermined low threshold value (step 422). If at step 422 the power measuring system determines that the confidence range (right side of equation) is lower than the predetermined low threshold value, then the power measuring system indicates that the signal is not present (step 424), with the operation ending thereafter.

If at step 422 the power measuring system determines that the lower value of the confidence range (left side of equation) fails to be higher than a predetermined high threshold value and that the confidence range (right side of equation) fails to be lower than the predetermined low threshold value, then the power measuring system determines whether the sample mean current value $\hat{X}$ is higher than the average of the predetermined high threshold and the predetermined low threshold (step 426). If at step 426 the power measuring system determines that the sample mean current value $\hat{X}$ is higher than an average of the predetermined high threshold and the predetermined low threshold, then the power measuring system indicates a probability that the signal is present (step 428). The power measuring system additionally computes a current confidence (step 430) utilizing the following equation:

$$Z_{\alpha/2} = |(\text{Threshold} - \hat{X})|\frac{\sqrt{n}}{\hat{S}}$$

The power measuring system further determines a number of samples required to achieve a desired confidence (step 432) utilizing the following equation:

$$n = \left(\frac{Z_{\alpha/2} \cdot \hat{S}}{|(\text{Threshold} - \hat{X})|}\right)^2$$

Once the number of samples is determined, the power measuring system indicates a wait time based on the current confidence, the desired confidence, and the number of samples (step 434), with the operation returning to step 402 thereafter.

If at step 426 the power measuring system determines that the sample mean current value $\hat{X}$ is lower than an average of the predetermined high threshold and the predetermined low threshold, then the power measuring system indicates a probability that the signal is not present (step 436), with the operation proceeding to step 430 thereafter.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for statistically determining power-circuit connectivity. In order to statistically determine power-circuit connectivity, the illustrative embodiments compute a sampled mean current value and standard deviation of the current value for a correlation signal. The mechanisms then compute a confidence range of the sampled mean current value and standard deviation of the current value over a number of integration cycles. Then utilizing the confidence range, the illustrative embodiments discriminate whether the correlation signal is present, not present, or there is not enough data to provide a definitive response as to whether the signal is present or not. Additionally, if the response is that there is not enough data to provide a definitive response as to whether the signal is present or not, the illustrative embodiments provide an estimate as to an amount of time required to provide the definitive response as to whether the signal is present or not.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for statistical determination of power circuit connectivity based on signal detection in a circuit, comprising:
    gathering signal data from the circuit; and
    determining whether a signal of interest is present in the gathered signal data from the circuit using a statistical analysis of the gathered signal data, wherein the statistical analysis comprises using a mean current value and statistical deviation of the current value of the signal data over a predetermined period of time to compute a confidence range and comparing the confidence range to a first threshold and a second threshold, wherein a determination that the signal is present is made in response to the confidence range being above the first threshold, and wherein a determination that the signal is not present is made in response to the confidence range being below the second threshold.

2. The method of claim 1, wherein a lower bound of the confidence range is used to determine whether the signal is present.

3. The method of claim 1, wherein a higher bound of the confidence range is used to determine whether the signal is not present.

4. The method of claim 1, further comprising:
    responsive to a lower bound of the confidence range being below the first threshold and responsive to the higher bound of the confidence range being above the second threshold, determining whether the mean current value is higher than an average of the first threshold and the second threshold; and
    responsive to the mean current value being higher than the average of the first threshold and the second threshold, indicating that the signal is probably present.

5. The method of claim 4, further comprising:
    determining a current confidence;
    determining a number of samples required to achieve a desired confidence; and
    indicating a wait time based on the current confidence, the desired confidence, and the number of samples.

6. The method of claim 4, further comprising:
    responsive to the mean current value being lower than the average of the first threshold and the second threshold, indicating that the signal is probably not present.

7. The method of claim 6, further comprising:
    determining a current confidence;
    determining a number of samples required to achieve a desired confidence; and
    indicating a wait time based on the current confidence, the desired confidence, and the number of samples.

8. The method of claim 1, further comprising:
    responsive to a lower bound of the confidence range being below the first threshold and responsive to the higher bound of the confidence range being above the second threshold, determining whether the mean current value is higher than an average of the first threshold and the second threshold;
    responsive to the mean current value being higher than the average of the first threshold and the second threshold, determining a first confidence that the signal is probably not present;
    responsive to the mean current value being lower than the average of the first threshold and the second threshold, determining a second confidence that the signal is probably not present;
    responsive to the first confidence being higher than the second confidence, indicating that the signal is present; and
    responsive to the second confidence being higher than the first confidence, indicating that the signal is not present.

9. A computer program product comprising a computer readable storage medium having a computer readable program stored therein, wherein the computer readable program, when executed on a computing device, causes the computing device to:
    gather signal data from the circuit; and
    determine whether a signal of interest is present in the gathered signal data from the circuit using a statistical analysis of the gathered signal data, wherein the statistical analysis comprises using a mean current value and statistical deviation of the current value of the signal data over a predetermined period of time to compute a confidence range and comparing the confidence range to a first threshold and a second threshold, wherein a determination that the signal is present is made in response to the confidence range being above the first threshold, and wherein a determination that the signal is not present is made in response to the confidence range being below the second threshold.

10. The computer program product of claim 9, wherein a lower bound of the confidence range is used to determine whether the signal is present and wherein a higher bound of the confidence range is used to determine whether the signal is not present.

11. The computer program product of claim 9, wherein the computer readable program further causes the computing device to:
    responsive to a lower bound of the confidence range being below the first threshold and responsive to the higher bound of the confidence range being above the second threshold, determine whether the mean current value is higher than an average of the first threshold and the second threshold; and
    responsive to the mean current value being higher than the average of the first threshold and the second threshold, indicate that the signal is probably present.

12. The computer program product of claim 11, wherein the computer readable program further causes the computing device to:
    determine a current confidence;
    determine a number of samples required to achieve a desired confidence; and
    indicate a wait time based on the current confidence, the desired confidence, and the number of samples.

13. The computer program product of claim 11, wherein the computer readable program further causes the computing device to:
    responsive to the mean current value being lower than the average of the first threshold and the second threshold, indicate that the signal is probably not present.

14. The computer program product of claim 13, wherein the computer readable program further causes the computing device to:
- determine a current confidence;
- determine a number of samples required to achieve a desired confidence; and
- indicate a wait time based on the current confidence, the desired confidence, and the number of samples.

15. An apparatus, comprising:
- a processor; and
- a memory coupled to the processor, wherein the memory comprises instructions which, when executed by the processor, cause the processor to:
- gather signal data from the circuit; and
- determine whether a signal of interest is present in the gathered signal data from the circuit using a statistical analysis of the gathered signal data, wherein the statistical analysis comprises using a mean current value and statistical deviation of the current value of the signal data over a predetermined period of time to compute a confidence range and comparing the confidence range to a first threshold and a second threshold, wherein a determination that the signal is present is made in response to the confidence range being above the first threshold, and wherein a determination that the signal is not present is made in response to the confidence range being below the second threshold.

16. The apparatus of claim 15, wherein a lower bound of the confidence range is used to determine whether the signal is present and wherein a higher bound of the confidence range is used to determine whether the signal is not present.

17. The apparatus of claim 15, wherein the instructions further cause the processor to:
- responsive to a lower bound of the confidence range being below the first threshold and responsive to the higher bound of the confidence range being above the second threshold, determine whether the mean current value is higher than an average of the first threshold and the second threshold; and
- responsive to the mean current value being higher than the average of the first threshold and the second threshold, indicate that the signal is probably present.

18. The apparatus of claim 17, wherein the instructions further cause the processor to:
- determine a current confidence;
- determine a number of samples required to achieve a desired confidence; and
- indicate a wait time based on the current confidence, the desired confidence, and the number of samples.

19. The apparatus of claim 17, wherein the instructions further cause the processor to:
- responsive to the mean current value being lower than the average of the first threshold and the second threshold, indicate that the signal is probably not present.

20. The apparatus of claim 19, wherein the instructions further cause the processor to:
- determine a current confidence;
- determine a number of samples required to achieve a desired confidence; and
- indicate a wait time based on the current confidence, the desired confidence, and the number of samples.

* * * * *